United States Patent [19]

Gallagher et al.

[11] Patent Number: 5,183,970

[45] Date of Patent: Feb. 2, 1993

[54] ORIENTED SUPERCONDUCTORS FOR AC POWER TRANSMISSION

[75] Inventors: William J. Gallagher, Dobbs Ferry; Thomas K. Worthington, New York, both of N.Y.

[73] Assignee: International Business Machines Corp., Armonk, N.Y.

[21] Appl. No.: 847,841

[22] Filed: Mar. 9, 1992

Related U.S. Application Data

[63] Continuation of Ser. No. 517,010, May 1, 1990, abandoned.

[51] Int. Cl.$^5$ .............................................. H01B 12/00
[52] U.S. Cl. ................................ 174/125.1; 174/15.4; 505/1; 505/704; 505/884; 505/885; 505/886; 505/887
[58] Field of Search ................... 174/15.4, 15.5, 125.1; 505/1, 704, 706, 884, 885, 886, 887

[56] References Cited

U.S. PATENT DOCUMENTS

| | | | |
|---|---|---|---|
| 3,191,055 | 3/1960 | Swihart et al. | 307/88.5 |
| 3,414,662 | 12/1968 | Klein et al. | 174/15.4 |
| 3,612,742 | 10/1971 | Snowden et al. | 174/15.5 |
| 3,717,773 | 2/1973 | Parmentier et al. | 307/201 |

FOREIGN PATENT DOCUMENTS

| | | | |
|---|---|---|---|
| 0292436 | 11/1988 | European Pat. Off. | |
| 0284721 | 11/1988 | Japan | 505/884 |
| 0146212 | 6/1989 | Japan | 505/885 |
| 0204311 | 8/1989 | Japan | 174/125.1 |

OTHER PUBLICATIONS

Japanese newspaper Sahi Shinbun, Mar. 10, 1987.
Japanese Journal of Applied Physics, vol. 26, No. 4, Apr. 1987, pp. L386–L387.
Report: Materials Research Society, Apr. 1987, S. Jin et al., pp. 219–221.
Physical Review Letters, vol. 58, No. 25, Jun. 1987, pp. 2687–2690.
Japanese Journal of Applied Physics, vol. 26, No. 4, Apr. 1987, pp. L524–L525.
Physical Review Letters, vol. 59, No. 10, Sep. 1987, pp. 1160–1163, T. K. Worthington.
Physical Review, vol. 36, No. 7, Sep. 1987, pp. 4025–4027, D. E. Farrell.
Science, Jun. 5, 1987, p. 1189.
Novel Superconductivity, S. A. Wolf and V. Z. Kresin, Jun. 1987, Plenum Press, New York, pp. 935–949.
Applied Physics Letters, vol. 54, No. 11, Mar. 1989, pp. 1054–1056, G. Koren et al.

*Primary Examiner*—Leo P. Picard
*Assistant Examiner*—Bot L. Ledynh
*Attorney, Agent, or Firm*—Perman & Green

[57] ABSTRACT

A superconductive transmission line is formed of mixed metallic oxide ceramic material, particularly $Y_1Ba_2Cu_3O_{7-x}$ drawn epitaxially upon a substrate. The superconductive material has basal crystallographic planes in alignment with copper oxide of the ceramic material. The planes are parallel to the substrate. The transmission line is constructed of a plurality of electrically conductive elements, each of which is formed of the superconductive material. The conductive elements are arranged with the crystalline planes parallel to an axis of the transmission line, along which axis power is to flow. Thereby, magnetic fields induced by currents flowing in the conductive elements intersect the conductive elements perpendicularly to the basal crystallographic planes to maximize the current which can flow while retaining linearity between magnetization and applied magnetic field. Thereby, alternating current can be transmitted by the transmission line without the introduction of hysteresis losses which would develop heat and quench the superconducting characteristic of the transmission line.

12 Claims, 4 Drawing Sheets

ORIENTED SUPERCONDUCTORS FOR AC POWER TRANSMISSION

This is a continuation of copending application Ser. No. 07/517,010 filed on May 1, 1990 now abandoned.

BACKGROUND OF THE INVENTION

This invention relates to superconductor power transmission lines and, more particularly, to the construction of a transmission line from superconductive elements having a crystallographic basal plane and anisotropic magnetic parameters relative to the basal plane, and wherein the superconductive elements are oriented with their basal planes perpendicular to the magnetic field of an electric current flowing through the elements of the transmission line so as to maximize the amount of current flow before introduction of magnetic hysteresis losses.

Superconductive material is employed currently in electrical equipment wherein it is essential to have large current densities. An example of such electrical equipment is nuclear magnetic resonance imaging equipment wherein inductor coils carrying relatively large amounts of direct current are employed for producing the relatively large magnetic fields required for activating the molecular electron energy levels in the detection of the emissions of radiation for forming the image. The flow of large currents in the conductor coils is made possible by a construction of the coils by superconductive material which operates without electrical resistance and without the generation of heat which would limit the current to much smaller values as is in the case of conventional conductor coils of the same physical size. As is well known, the superconductive material employed in present electrical equipment exhibits the superconductive characteristic only at very low temperatures, such as that of liquid helium. The low temperature requirement presents an inconvenience and additional cost in the operation of the equipment because of the need to pump liquid helium through the conductor coils to maintain the requisite low-temperature operating environment for the superconductor material.

Recently, significant amounts of research have been undertaken for the involvement of superconductive material which can operate at significantly warmer temperatures than the temperature of liquid helium. The availability of such materials suggest that it may be possible to construct electrical equipment of superconductive elements wherein the cooling requirement is less severe. This would reduce the task of cooling the superconductive material. For example, if superconductive material operative at much warmer temperatures such as the temperature of liquid nitrogen, rather than the temperature of liquid helium, would be available for the construction of electrical equipment, the cost of operating the equipment would be greatly reduced because of the greater availability of liquid nitrogen as compared to the availability of liquid helium.

A number of materials exhibiting superconductivity at temperatures elevated with respect to that of liquid helium have been investigated. Noteworthy among these materials are mixed metallic oxides which may be characterized, generally speaking, as ceramics. The following literature is exemplary of published articles describing the manufacturer and characteristics of materials having semiconductor characteristics at elevated temperatures. The Japanese newspaper SAHI SHINBUN issue of Mar. 10, 1987, discloses a compound of La, Cu, Sr, and O which has been formed as a ceramic tape with a thickness of 20–30 microns. The Japanese JOURNAL of APPLIED PHYSICS, Vol. 26, No. 4, April 1987, pages L386–L387 discloses a Ba-La-Cu-O and a Sr-La-Cu-O system having phases which undergo a superconducting transition. The report on the meeting of the Materials Research Society, April 1987, presents a report by S. Jin et al disclosing $Ba_2YCu_3O_7$ alone and as a composite with silver at pages 219–221. The PHYSICAL REVIEW LETTERS, Vol. 58, No. 25, June 1987, pages 2688–2689 discloses inhomogeneities and magnetization hysteresis with respect to $Y_1Ba_2Cu_3O_{7-x}$. The Japanese JOURNAL OF APPLIED PHYSICS, Vol. 26, No. 4, April 1987, pages L524–L525, discloses superconducting single crystal thin films described by the formula $(La_{1-x}Sx)_2CuO_4$ with respect to the Hall effect in superconducting thin films The PHYSICAL REVIEW LETTERS, Vol. 58, No. 25, June 1987, in an article on pages 2687–23690 by T. R. Dinger et al discloses single crystals of $Y_1Ba_2Cu_3O_{7-x}$ having facets measuring 200 microns and larger up to 0.5 millimeters, and having anisotropic characteristics in a layered structure. An article in The PHYSICAL REVIEW LETTERS, Vol. 59, No. 10, September 1987, pages 1160–1163 by T. K. Worthington et al discloses critical magnetic fields in different directions in a single crystal of $Y_1Ba_2Cu_3O_{7-x}$. An article in The PHYSICAL REVIEW, Vol. 36, No. 7, September 1987, pages 4025–4027 by D. E. Farrell discusses alignment under magnetic field of $Y_1Ba_2Cu_3O_{7-x}$. An article in SCIENCE, Jun. 5, 1987, page 1189 discloses the production of superconductors as epitaxial layers or films on substrates of strontium titanate. An overview of superconducting materials such as the Y-Ba-Cu-O system and related substances is disclosed in a book entitled NOVEL SUPERCONDUCTIVITY by S. A. Wolf and V. Z. Kresin published in 1987 by Plenum Press, New York, pages 935–949. An article in APPLIED PHYSICS LETTERS, Vol. 54, No. 11, March 1989, pages 1054–1056 by G. Koren et al discloses superconducting material fabricated as epitaxial films of $YBa_2Cu_3O_{7-x}$ on substrates of $NdGaO_3$, $LaGaO_3$, and $SrTiO_3$ by Laser ablation.

One significant aspect of the foregoing studies is that these materials are anisotropic, and that a magnetic field, whether generated by a current flowing within the material itself or generated by an external current can terminate the superconductive phase. Also of significance is the fact that magnetization hysteresis associated with alternating current flow may introduce losses and heating associated with such losses. Such hysteresis does not present a limitation on the superconductivity for electrical equipment employing direct current (DC), but would present a limitation by way of example, in the important situation of transmission of power by alternating current (AC). The directions of the magnetic field are given with respect to the basal crystallographic plane useful in describing the anisotropic properties of superconductive materials such as $Y_1Ba_2Cu_3O_{7-x}$ wherein the plane is defined by an oxide of copper. The magnetic fields, or components thereof, are either parallel to or perpendicular to the basal plane.

A problem arises in that there are limitations on the use of such superconductive materials for the transmission of AC power. One limitation on the maximum current that can be efficiently transmitted is the introduction of losses by magnetization hysteresis. A second limitation is the quenching of the superconductivity by excessively large magnetic fields produced within an electrical conductor by current flowing through the conductor, or through a second conductor lying alongside the first conductor as in the case of a transmission line comprising a pair of conductors or a plurality of conductors as in three-phase or multi-phase power transmission. Existing transmission line structures are not configured for maximizing the current and power transmission capabilities of superconductive materials.

SUMMARY OF THE INVENTION

The aforementioned problem is overcome and other advantages are provided by a system operating in accordance with the invention for the transmission of power via alternating current in a superconductor transmission line. The superconductive material selected for a preferred embodiment of the invention is the yttrium-barium-copper-oxygen ceramic system, or specifically, $Y_1Ba_2Cu_3O_{7-x}$ which has been found to provide a critical value of magnetic field which allows for higher current densities than other such ceramic materials, particularly for the transmission of alternating current without the introduction of losses induced by magnetization hysteresis. Furthermore, in accordance with a major feature of the invention, the ceramic material is formed with a basal crystallographic plane defined by the copper oxide portion of the mixed crystal, and wherein the ceramic material is formed as a plurality of superconductive elements each with its own basal plane. The individual elements are supported in an array wherein the basal planes are oriented in the array disposed about a path of current flow with the basal planes oriented perpendicularly to lines of magnetic flux induced by the current.

The perpendicular orientation of the basal planes in the array of superconductive elements relative to the magnetic flux maximizes the amount of alternating current which can be transmitted through the superconductive transmission line because of the anisotropic magnetic properties of a superconductive material. Generally speaking, the same form of relationship among the superconductive region, the value of applied magnetic field, and the temperature of the material exists both for magnetic fields which are parallel to the basal plane and which are perpendicular to the basal plane. However, the critical values of the magnetic fields defining the boundaries of the superconductive region differ in the two cases of parallel and perpendicular fields relative to the basal plane. This matter will be discussed briefly to enable a more complete appreciation of the features of the invention.

Beginning at zero degrees Kelvin and proceeding up to the critical temperature Tc, superconductivity is present in the material up to a value of $H_{c1}$, the lower critical value of applied magnetic field. The value of a critical field decreases until the critical temperature Tc is reached at which temperature no superconductivity is present for all values of applied magnetic field. At temperatures between zero degrees Kelvin and Tc, inhomogeneities in the material pin the magnetic flux to retain the superconductive state even for higher values of applied magnetic field up to an upper critical field value $H_{c2}$. The value of $H_{c2}$ is a maximum at zero degrees and decreases with increasing temperature up to a temperature of Tc wherein the superconductivity disappears for all values of applied magnetic field. In the foregoing relationship, which is readily plotted on a graph, in the region of the graph wherein the applied magnetic field is less than the lower critical field, there is no measurable magnetic field present in the superconductive material. However, in the region of the graph between the lower and the upper critical values of field, there is a non-zero measurable value of magnetic field.

In the electrical equipment wherein it is decided to employ only direct current, it is useful to operate the superconductor material up to values of $H_{c2}$, the upper critical field, so as to allow for a maximum value of current density in the material. However, such is not the case for transmission of alternating current through the superconducting material. In the region of the graph below the lower critical field, the material responds linearly to the applied magnetic field such that the magnetization produced within the material is equal and opposite to the applied magnetic field to produce zero measurable field within the material. However, within the region of the graph between the lower and the upper critical fields, the material responds nonlinearly to the applied magnetic field resulting in heating and power loss due to a nonlinear relationship between magnetization of the material and the applied magnetic field. Therefore, in order to use the superconductive material successfully in the transmission of alternating current, the current density must be kept sufficiently low such that magnetic fields produced by the current flow are less than the critical field $H_{c1}$.

Therefore, to use the superconducting material optimally, it is important to orient the basal plane relative to the applied magnetic field to produce a maximum value of $H_{c1}$, the lower critical field. It has been discovered by the inventors herein that the maximum value of $H_{c1}$ is obtained in the situation wherein the applied magnetic field is oriented perpendicularly to the basal plane. Accordingly, the invention provides for a construction of the transmission line which allows for orientation of the basal plane perpendicularly to the magnetic field produced by current flowing through the transmission line. Since, as is well known, the magnetic field produced by an electric current encircles the current path in a closed loop, it is necessary to provide a geometrical arrangement of the conductors which allows for perpendicularity, or substantial perpendicularity, between the basal planes and the magnetic field produced by the current.

Two embodiments of the transmission line demonstrate the inventive concept of aligning the basal planes perpendicularly to the magnetic field induced by the current. In a first of these embodiments, two electrical conductors are arranged side-by-side with currents flowing in opposite directions in the conductors. Each of the conductors is fabricated of an array of superconducting elements. Central longitudinal axes of the two conductors define a common plane of the two conductors. In the arrays of the superconducting elements, the basal planes of the respective elements in each of the conductors are oriented parallel to the common plane of the two conductors. Thereby, the magnetic fields resulting from the currents in the two conductors, as measured in either of the conductors, are found to be substantially perpendicular to the basal planes.

In a second of the embodiments, the two conductors are arranged coaxially, one within the other. Each conductor is fabricated of an array of superconducting elements wherein the basal planes of each element in each of the conductors are parallel to a central cylindrical axis and extend in a radial direction of the axis. The currents flowing in opposed directions in the inner and the outer conductors produce a magnetic field directed cylindrically about the axis and extending into the regions of the two conductors. The radial arrangement of the basal planes provides for perpendicular orientation of the resulting magnetic field to the basal planes everywhere within the conductors. In both of the embodiments of the invention, the anisotropic properties of the superconductor material are employed to provide for the maximum value of lower critical field to ensure linear operation of the superconducting material for optimum transmission of AC power.

BRIEF DESCRIPTION OF THE DRAWING

The aforementioned aspects and other features of the invention are explained in the following description, taken in connection with the accompanying drawing wherein.

DETAILED DESCRIPTION

Figure 1:
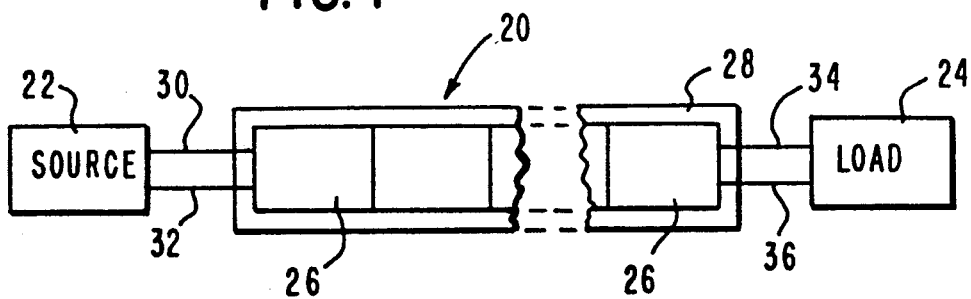
FIG. 1 constructed in accordance with a first embodiment of the invention, is a diagrammatic view of a transmission line constructed of superconductive material, in accordance with the invention, carrying alternating current between a source and a load.

FIG. 1 shows a superconductive transmission line 20 interconnecting a source 22 of electric power with an electrical load 24. The line 20 is composed of transmission-line sections 26 arranged serially one behind the other and connected electrically to each other, the sections 26 being supported within a frame 28. A first one of the sections 26 facing the source 22 is connected to the source 22 by a pair of electrically conductive leads 30 and 32. A last one of the sections 26 facing the load 24 is connected to the load 24 by a pair of leads 34 and 36. Each of the sections 26 is constructed of a plurality of electrically conductive elements formed of superconducting material as will be described now in detail with reference to FIGS. 2-5.

Figure 2:
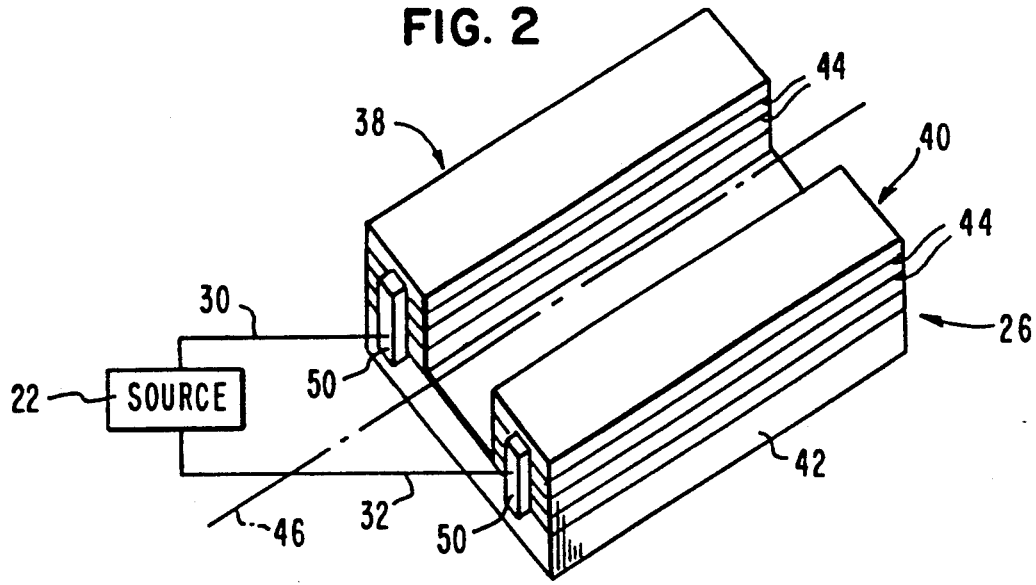
FIG. 2 is a perspective view, partially diagrammatic, of a section of the transmission line of FIG. 1, the section having two electrical conductors spaced apart from each other and mounted on an insulating substrate.
Figure 3:
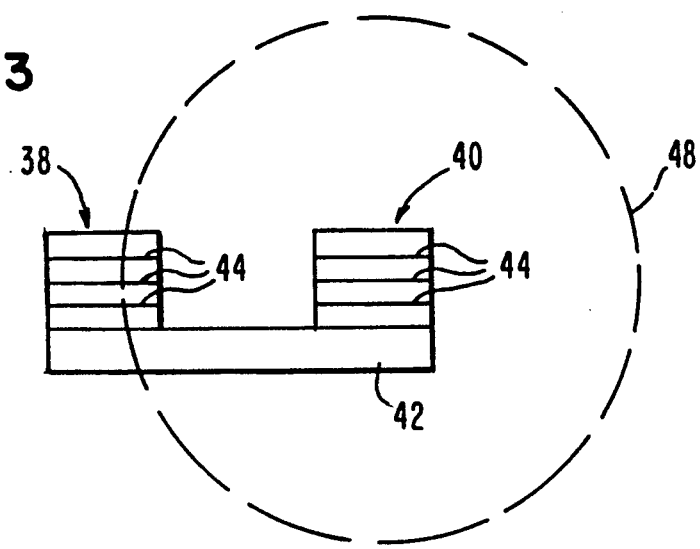
FIG. 3 is an end view of the transmission-line section of FIG. 2 and shows diagrammatically an induced magnetic field perpendicularly intersecting crystallographic planes of the superconducting material.

FIGS. 2-3 show a construction of a transmission-line section 26 in accordance with a first embodiment of the invention. The section 26 comprises a first electrically conductive element 38 and a second electrically conductive element 40 supported by an insulated plate 42. The first element 38 serves as an electrical conductor for conducting current from the source 22 toward the load 24, and the second element 40 serves as an electrical conductor for conducting current in the reverse direction from the load 24 to the source 22. Each of the elements 38, 40 is constructed of superconducting material having basal crystallographic planes 44 oriented parallel to the plate 42. Current flowing parallel to an axis 46 of the transmission-line section 26 induces a magnetic field 48, as represented by a dashed line FIG. 3, which is directed in a plane perpendicular to the axis 46 and encircles the path of current, such as the path of current in the second element 40, as shown in FIG. 3. Lines of the magnetic field 48 intersect the planes 44 substantially perpendicularly at the first element 38. Similarly, the current flowing in the first element 38 induces a magnetic field which substantially perpendicularly intersects the planes 44 of the second element 40. By way of example, in the construction of the transmission line 20, the leads 30 and 32 may be connected to the elements 38 and 40 by bars 50 extending across the planes 44 and fixed to end surfaces of the elements 38 and 40.

Figure 4:
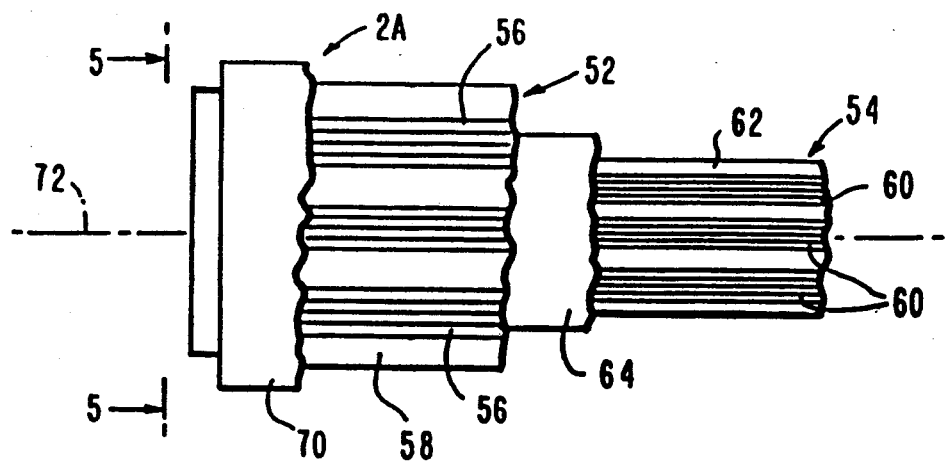
FIG. 4 is a section of the transmission line of FIG. 1 constructed in accordance with a further embodiment of the invention wherein inner and outer conductors are arranged coaxially, the view of FIG. 4 being a side view partially cutaway to show various components of the transmission-line section.
Figure 5:
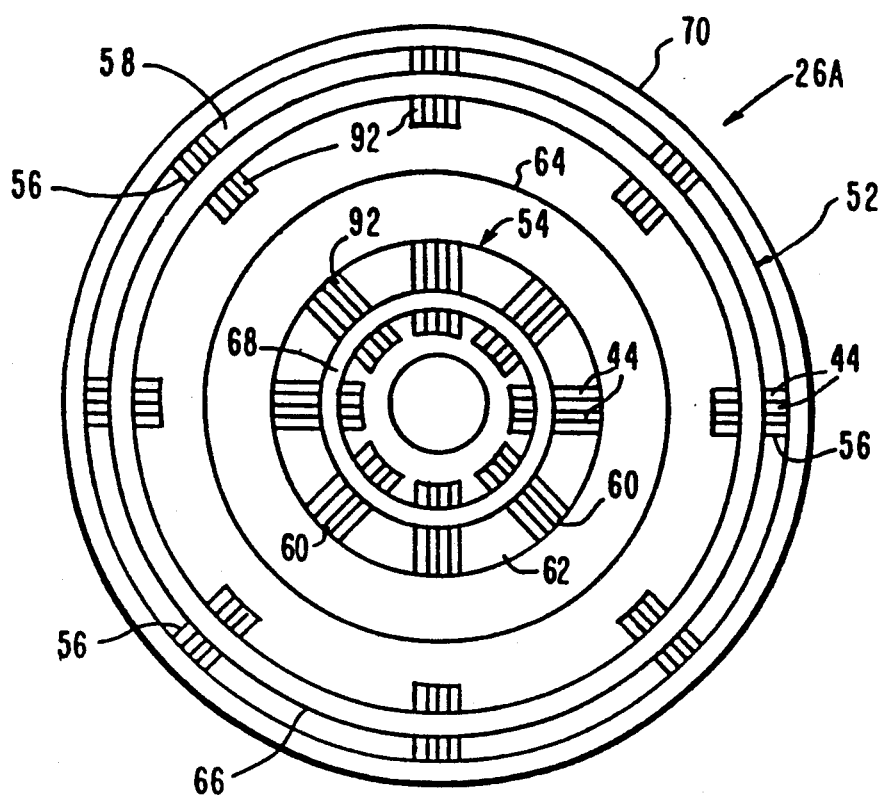
FIG. 5 is an end view of the transmission-line section taken along the line 5—5 in FIG. 4.

FIGS. 4 and 5 show a transmission-line section 25A in an embodiment of the invention which is alternative to the embodiment of the section 26 disclosed in FIGS. 2 and 3. In FIGS. 4 and 5, the transmission-line section 26A is constructed as a coaxial electric line having an outer electrically conductive assembly 52 and an inner electrically conductive assembly 54. The outer assembly 52 is formed of an array of electrically conductive elements 56 supported on a yoke 58, and the inner assembly 54 is formed of an array of electrically conductive elements 60 supported on a yoke 62. The yoke 62 is mounted coaxially to and within the yoke 58, and is separated from the yoke 58 by a coaxially disposed sleeve 64 of electrically insulating material. Similarly, the yokes 58 and 62 are constructed also of electrically insulated material such as plastic or ceramic. Electrically conductive rings 66 and 68 are employed, respectively, for the inner and outer conductors for making connection with the leads 30 and 32 (FIG. 2), the rings 66 and 68 being mounted to end surfaces of the outer and the inner yokes 58 and 62 and in electrical contact with the elements 56 and 60, respectively. An electrically insulating jacket 70 may be placed upon an outer assembly 52 to cover the transmission-line section 26A and to protect the section 26A from the environment.

With reference to both FIGS. 3 and 5, it is noted that the current passing through the inner assembly 54 induces a magnetic field which encircles an axis 72 of the transmission-line section 26A in the manner of the encirclement of the lines of the field 48 of FIG. 3, and therefore passes through the elements 56 of the outer assembly 52 and the element 60 of the inner assembly 54 in a direction perpendicular to the basal crystallographic planes of these elements. It is noted that the electrically conductive elements 38 and 40 (FIGS. 2 and 3) and the electrically conductive elements 56 and 60 (FIGS. 4 and 5) are all constructed in the same fashion and of the same superconducting material, and that all of these elements have basal crystallographic planes 44. The arrangements of these elements and their planes 44 in the embodiments of FIGS. 2-3 and 4-5 provide the common inventive feature of orienting the induced magnetic field in a direction which is perpendicular to the planes 44.

In the foregoing preferred embodiments of the invention, the electrically conductive elements 38, 40, 56, and 60 are constructed of a mixed metallic oxide ceramic preferably $Y_1Ba_2Cu_3O_{7-x}$ with the crystallographic planes 44 being Cu-O planes. While the yttrium-barium-copper- oxygen system of superconducting material is employed in the preferred embodiments of the invention, it is to be understood that the teachings of orienting an assembly of superconducting elements with crystallographic plane perpendicular to the magnetic field induced by current in the transmission line applies also to other superconducting materials having basal crystallographic planes. The bars 50 (FIG. 2) and the rings 66 and 68, (FIGS. 4-5) are constructed of copper or other suitably electrically conductive material. With reference also to the assembly of transmission-line sections 26 of FIG. 1, it is preferred that superconductive material in each of the sections 26 or 26A extend slightly beyond end surfaces of the supporting matrix of insulating material, namely, the plate 42 (FIG. 2) or the yokes 58 and 62 (FIG. 5) so as to permit electrical contact between the electrically conductive elements among the successive transmission line sections of the transmission line 20 in both embodiments of the invention. The frame 28 (FIG. 1) provides force which urges the transmission-line sections together to ensure good electrical contact between the successive transmission-line sections.

Figure 6:
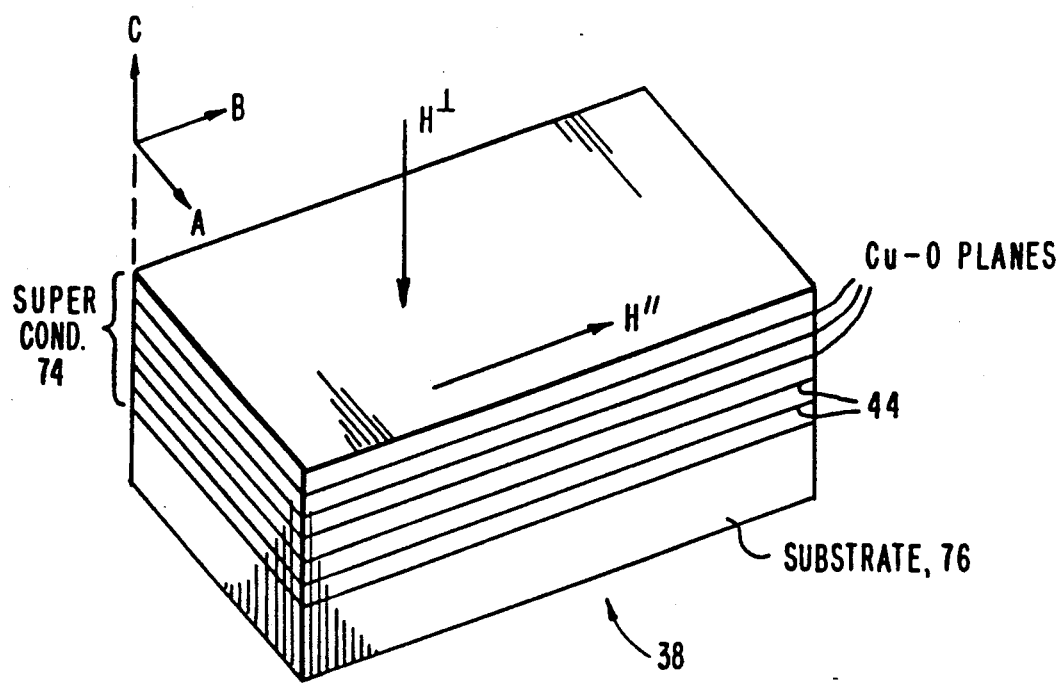
FIG. 6 is a perspective view of a block of superconducting material mounted upon a substrate with basal crystallographic planes oriented parallel to the substrate.

FIG. 6 shows an enlarged view of a portion of an electrically conductive element such as any one of the elements 38, 40, 56, or 60. To facilitate the description, the description of FIG. 6 is applied to the element 38 of FIGS. 2 and 3, it being understood that the description applies equally well to all of the other electrically conductive elements. The element 38 is composed of a layer 74 of the foregoing superconductive material epitaxially grown upon a substrate 76. The substrate 76 may be fabricated of $NdGaO_3$, $LaGaO_3$, or $SrTiO_3$, for example. Use of these materials in the substrates permits epitaxial growth of films of $Y_1Ba_2Cu_3O_{7-x}$ with Cu-O planes, namely the foregoing planes 44, oriented parallel to the substrate 76.

Figure 7:
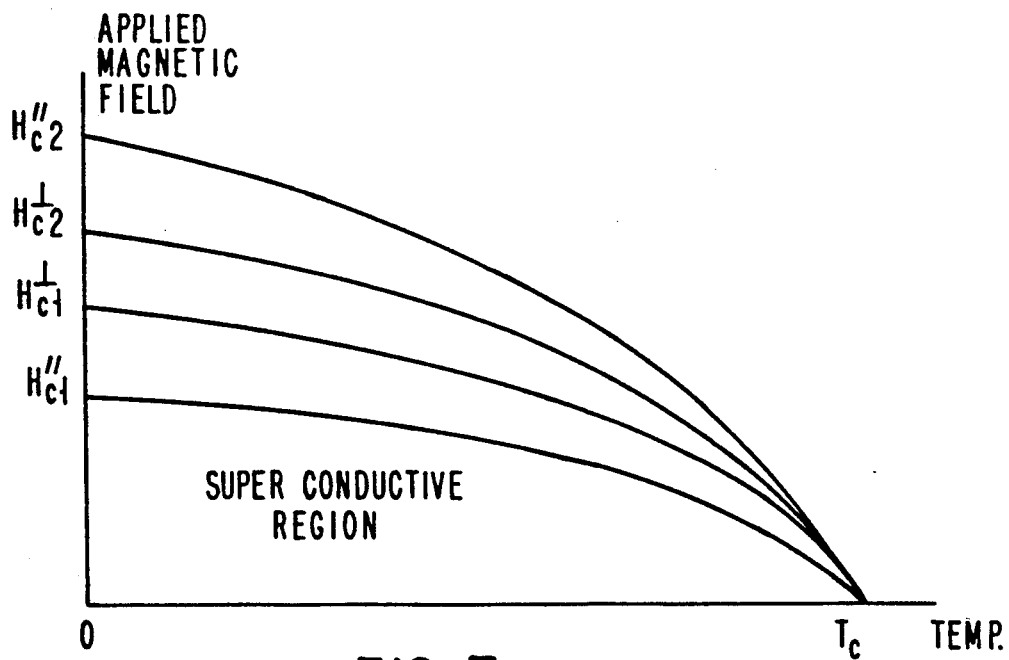
FIG. 7 is a graph showing regions of superconductivity bounded by applied critical magnetic fields and critical temperature for various orientations of applied magnetic field, and including both the Meissner region and the mixed state wherein magnetic flux is pinned.

With reference also to FIG. 7, it is noted that the superconducting material employed in the preferred embodiment of the invention is anisoptropic and provides a response to applied magnetic field which differs in dependence on the orientation of the applied magnetic field, H, to the basal crystallographic planes 44. In the case of applied field which is parallel to the planes 44, the lower critical field $H_{c1}$ and the upper critical field $H_{c2}$ are relatively far apart in value at zero degrees Kelvin. However, in the case of applied magnetic field perpendicular to the planes 44, the lower and upper critical values $H_{c1}$ and $H_{c2}$ are closer together and fall between the corresponding critical field value of applied field parallel to the planes 44. The relationship among the various values of critical field, shown along the vertical axis of the graph of FIG. 7, is such that the product of the upper and the lower critical field values in the case of field parallel to basal plane 44 is equal to the product of the upper and the lower critical field values in the case of field perpendicular to basal plane 44.

Figure 8:
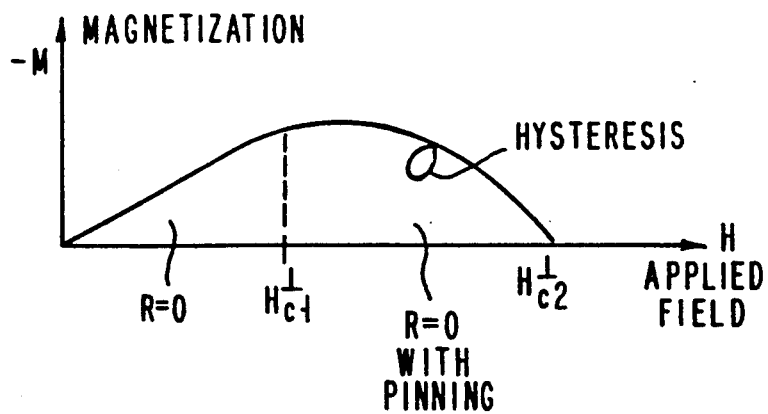
FIG. 8 is a graph showing magnetization versus applied field demonstrating linearity in the Meissner region and the introduction of hysteresis at higher magnetic fields with flux pinning.

With reference also to FIG. 8, an important feature of the invention is the capacity to transmit alternating current at relatively large values of critical current, namely, the value of current which quenches the superconductor effect. FIG. 8 shows the superconductive region as a function of applied field at a low temperature wherein the superconductive effect is present. For field strength below the lower critical value, there is a linear relationship between the applied field and the magnetization induced within the superconductive material. The magnetization, M, is shown as a negative quantity to cancel the applied field, H, so as to cancel the applied field and provide for a zero value of measurable field, B, within the superconducting material. For values of applied field between the lower and the upper critical values of applied field, the relationship between magnetization and applied field is nonlinear. As a result, a variation in the applied field, as would occur even with a relatively small variation in current flow to the transmission line 20, would induce hysteresis with resultant generation of heat in the superconducting material and a consequent loss, or quenching, of the superconductive effect.

Therefore, in accordance with an important feature of the invention, it is desired to maximize the amount of the lower critical value of applied field so as to maximize the linear region. This allows for a maximum value of alternating current without introduction of the hysteresis.

As shown in FIG. 7, the lower critical value of applied field, for the situation wherein the applied field is perpendicular to the basal planes 44, is greater than the lower critical field, for the case wherein the applied field is parallel to the basal planes 44. Accordingly, it is a major principle of the invention to orient the basal planes in a direction perpendicular to magnetic fields induced by currents flowing in the transmission line 20. This principle of orientation of the basal planes 44 is accomplished, in accordance with the invention, by the two embodiments of the invention described above with reference to FIGS. 2-3, and 4-5. Therefore, as shown in FIG. 8, even though the d.c. resistance R of the superconducting material is equal to zero both below and above the lower critical value of applied field, assuming that the flux has been pinned by inhomogeneities of the material, the superconducting material is to be operated only under conditions wherein the applied magnetic field is below the lower critical value.

Figure 9:
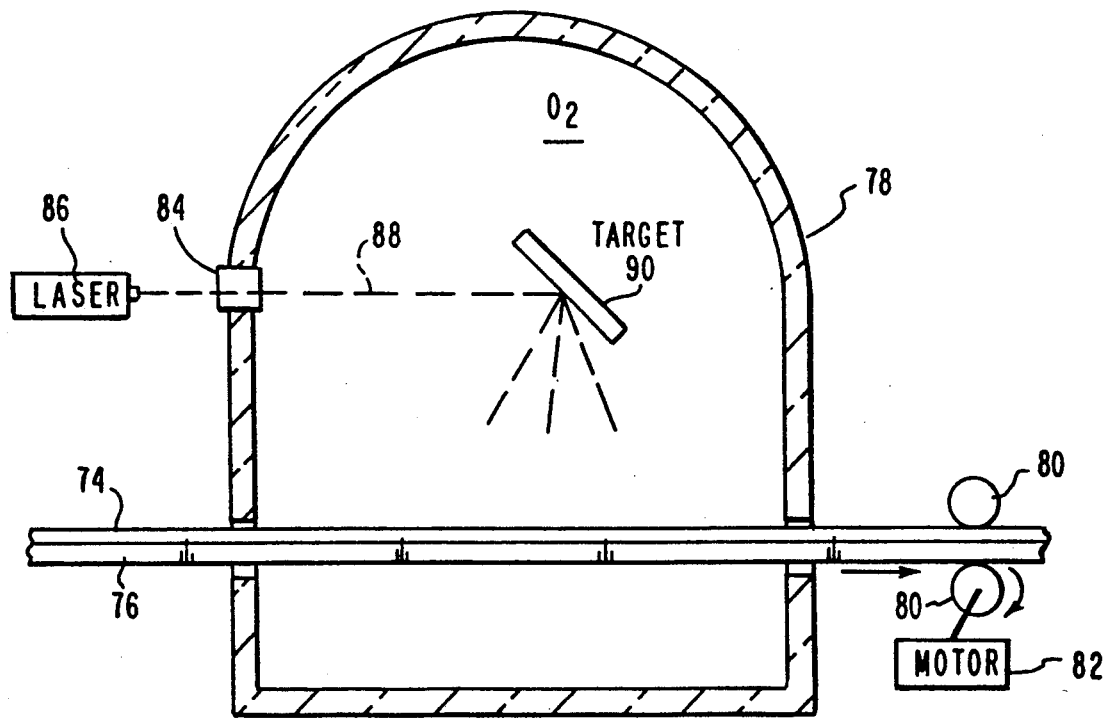
FIG. 9 shows apparatus for constructing electrically conductive elements to be employed in the constructions of the embodiments of FIGS. 2-3 and 4-5.

FIG. 9 indicates schematically a mode of fabrication of the electrically conductive element 38, the description here being applicable also to the elements 40, 56, and 60 which are understood to be of the same construction as the element 38. The element 38 is constructed, as disclosed in FIG. 6, as a film or layer 74 of the superconducting material grown epitaxially upon the substrate 76. It is intended to provide the substrate 76 in relatively long sections, possibly a meter or longer, which, during manufacture of the element 38 is to be drawn through a vacuum deposition chamber 78 by rollers 80 driven by a motor 82. A wall of the chamber 78 is provided with a window 84 through which a laser 86 transmits a beam 88 of radiation which illuminates a target 90 of $Y_1Ba_2Cu_3O_{7-x}$ to ablate material of the target and deposit the material as a film upon the substrate 76. The material of the substrate encourages the epitaxial crystalline growth of the superconductor material with Cu-O planes parallel to the substrate. During motion of the substrate 76 through the chamber 78, the various portions of the substrate 76 are retained in the region of deposition of the superconducting material for sufficient amount of time to allow the film to grow to a sufficient depth such that the current density is low enough to avoid generation of a magnetic field which exceeds the lower critical value. By adjusting the width and the depth of the superconductive layer 74, the transmission line 20 is adapted to carry a desired amount of alternating current while retaining the superconductive state and avoiding the generation of losses produced by magnetic hysteresis. The environment within the chamber 78 is an oxygen enriched environment to provide the desired superconducting properties to the layer 74. Further details in the construction of superconductive layers of the foregoing material are disclosed in the literature listed above.

Upon completion of a construction of the electrically conductive elements by use of the manufacturing technique disclosed in FIG. 9, the elements are then stacked upon the plate 42, in the case of the first embodiment of the invention, or are stacked within slots 92 of the yokes 58 and 62 in the embodiment of FIGS. 4 and 5.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A power transmission line comprising:
a plurality of electrically conductive elements arranged in a first set of elements and a second set of elements spaced apart from said first set of elements, the elements of each of said sets being arranged along an axis oriented in a direction of power flow, each element of each of said sets comprising a superconductive material having anisotropic magnetic parameters and a crystalline structure formed about a basal crystalline plane, the material in each element exhibiting superconductivity and a linear hysteresis-free magnetization characteristic in the presence of an applied magnetic field less than a lower critical field, the lower critical field having a maximum value in a direction perpendicular to the basal plane;
means for supporting said electrically conductive elements in each of said sets with their respective basal crystallographic planes substantially parallel to said axis, said supporting means holding said first and said second sets of elements in an array to form a conductor of said transmission line;
wherein, upon transmission of electric current through the transmission line in a direction of said axis, a flow of current in one of said sets of elements produces a magnetic field directed perpendicularly to the basal plane of an element of the other of said sets of elements.

2. A transmission line according to claim 1 wherein said supporting means supports said plurality of elements in each of said first and said second sets of elements with their respective basal plane substantially parallel to each other, said supporting means holding said elements in said first set and in said second set of elements wherein said first set of elements serves to conduct electric current in a first direction parallel to said axis and said second set of elements serves to conduct electric current in a second direction opposite said first direction.

3. A transmission line according to claim 2 wherein said first set of elements is electrically insulated from said second set of elements, said hysteresis-free magnetization characteristic facilitating transmission of alternating current.

4. A transmission line according to claim 3 wherein said superconductive material is a crystal consisting of a plurality of metal oxides.

5. A transmission line according to claim 3 wherein said superconductive material is a ceramic system of yttrium-barium-copper-oxide.

6. A transmission line according to claim 3 wherein said superconductive material is $Y_1Ba_2Cu_3O_{7-x}$.

7. A transmission line according to claim 1 wherein each of said sets of elements is supported in a cylindrical array with cylindrical symmetry about said axis, said basal planes of said first and said second sets of elements being oriented in directions extending substantially radially outward of said axis.

8. A transmission line according to claim 7 further comprising:
a second support means for supporting said second set of elements in a second cylindrical array about said axis with their respective basal planes being substantially parallel to and extending in directions substantially radially outward from said axis, the elements of said first set of elements being disposed in a first cylindrical array about said axis; and
wherein said second array is disposed within said first cylindrical array to provide a coaxial configuration to said transmission line, said hysteresis-free magnetization characteristic facilitating transmission of alternating current.

9. A transmission line according to claim 8 wherein said superconductive material is a crystal consisting of a plurality of metal oxides.

10. A transmission line according to claim 8 wherein said superconductive material is a ceramic system of yttrium-barium-copper-oxide.

11. A transmission line according to claim 8 wherein said superconductive material is $Y_1Ba_2Cu_3O_{7-x}$.

12. A power transmission line comprising:
a plurality of electrically conductive elements, the elements being arranged along an axis oriented in a direction of power flow, each element comprising a superconductive material having anisotropic magnetic parameters and a crystalline structure formed about a basal crystallographic plane, the material in each element exhibiting superconductivity and a linear hysteresis-free magnetization characteristic in the presence of an applied magnetic field less than a lower critical field, the lower critical field having a maximum value in a direction perpendicular to the basal plane; and
means for supporting said electrically conductive elements with their respective basal crystallographic planes extending radially outward from said axis, said supporting means holding a set of elements of said plurality of elements in an array to form a conductor of said transmission line.

* * * * *

UNITED STATES PATENT AND TRADEMARK OFFICE
CERTIFICATE OF CORRECTION

PATENT NO. : 5,183,970

DATED : February 2, 1993

INVENTOR(S) : William J. Gallager and Thomas K. Worthington

It is certified that error appears in the above-identified patent and that said Letters Patent is hereby corrected as shown below:

In column 9, line 41, the word "crystalline" should read --crystallographic--.

Signed and Sealed this

Ninth Day of November, 1993

Attest:

BRUCE LEHMAN

Attesting Officer

Commissioner of Patents and Trademarks